(12) United States Patent
Zhang

(10) Patent No.: US 7,661,845 B2
(45) Date of Patent: Feb. 16, 2010

(54) LED LAMP

(75) Inventor: Wen-Xiang Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/256,480

(22) Filed: Oct. 23, 2008

(65) Prior Publication Data

US 2009/0268447 A1 Oct. 29, 2009

(30) Foreign Application Priority Data

Apr. 23, 2008 (CN) .................. 2008 1 0066774

(51) Int. Cl.
*F21V 29/00* (2006.01)
(52) U.S. Cl. .................. 362/249.02; 362/800; 362/294; 362/373
(58) Field of Classification Search .............. None
See application file for complete search history.

(56) References Cited

U.S. PATENT DOCUMENTS

| 6,580,228 | B1 * | 6/2003 | Chen et al. .............. 315/185 R |
| 6,715,900 | B2 * | 4/2004 | Zhang ........................ 362/294 |
| 2008/0212325 | A1 * | 9/2008 | Wang ........................ 362/294 |
| 2008/0247162 | A1 * | 10/2008 | Chen ........................ 362/231 |

\* cited by examiner

*Primary Examiner*—Laura Tso
(74) *Attorney, Agent, or Firm*—Frank R. Niranjan

(57) ABSTRACT

An LED lamp includes a lamp base with a plate-like shape, a bracket mounted on a top side of the lamp base, a heat sink fixed on the bracket, two LED modules respectively attached on two opposite ends of the heat sink, and a housing engaging on the lamp base and enclosing the bracket, the heat sink and the LED modules therein. The bracket includes two horizontal sections coupled to the lamp base, two connecting sections respectively abutting against the two opposite ends of the heat sink and a pair of fixing arms for suspending the heat sink above the lamp holder. Each fixing arm extends upwardly from a corresponding horizontal section and connects with a corresponding connecting section.

20 Claims, 4 Drawing Sheets

LED LAMP

BACKGROUND

1. Field of the Invention

The disclosure relates to an LED lamp, and particularly to an LED lamp used as an outdoor lamp.

2. Description of Related Art

An LED lamp is a type of solid-state lighting that utilizes light-emitting diodes (LEDs) as a source of illumination. The LED lamp is intended to be a cost-effective yet high quality replacement for incandescent and fluorescent lamp because the LED lamp has features of long-term reliability, environment friendliness and low power consumption.

A conventional LED lamp comprises a heat sink having a flat base and a plurality of fins arranged on a surface of the base, and a plurality of LED modules having LEDs attached on another opposite surface of the base. Since the LEDs are mounted on a single planar surface of the heat sink, the LEDs can only serve as an obverse light source, which provides with an illumination in a simplex illuminating orientation and would not meet a certain need, such as an illumination with double illuminating orientations. Furthermore, in the conventional LED lamp, the fins are exposed to an outside, whereby the fins are easily attacked by rainwater and dust to be corroded. In addition, the rainwater may creep from the fins through an interface between the base and a seal into the LED lamp to wet and damage the LEDs and electrical circuitry of the LED lamp.

What is needed, therefore, is an LED lamp having double illuminating orientations.

SUMMARY

An LED lamp includes a lamp base with a plate-like shape, a bracket mounted on a top side of the lamp base, a heat sink fixed on the bracket, two LED modules respectively attached on two opposite ends of the heat sink, and a housing engaging on the lamp base and enclosing the bracket, the heat sink and the LED modules therein. The bracket includes two horizontal sections coupled to the lamp base, two connecting sections respectively abutting against the two opposite ends of the heat sink and a pair of fixing arms respectively extending upwardly from two opposite ends of each horizontal section for suspending the heat sink above the lamp base. Each fixing arm correspondingly interconnects a connecting section and a horizontal section.

Other advantages and novel features of the present invention will become more apparent from the following detailed description of an embodiment/embodiments when taken in conjunction with the accompanying drawings.

BRIEF DESCRIPTION OF THE DRAWINGS

Many aspects of the present LED lamp can be better understood with reference to the following drawings. The components in the drawings are not necessarily drawn to scale, the emphasis instead being placed upon clearly illustrating the principles of the present LED lamp. Moreover, in the drawings, like reference numerals designate corresponding parts throughout the several views.

DETAILED DESCRIPTION

Figure 1:
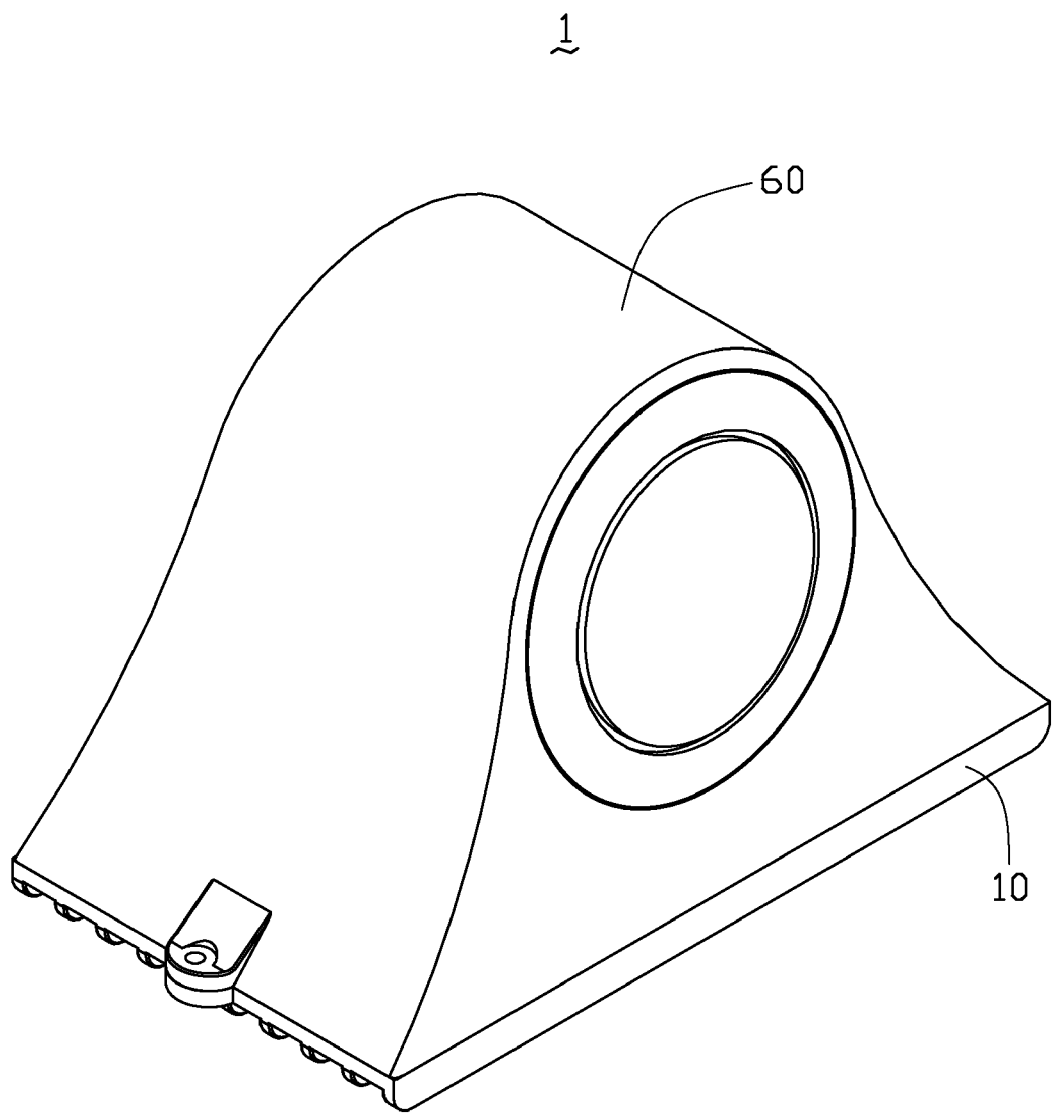
FIG. 1 is an isometric, assembled view of an LED lamp in accordance with a preferred embodiment of the present invention.
Figure 2:
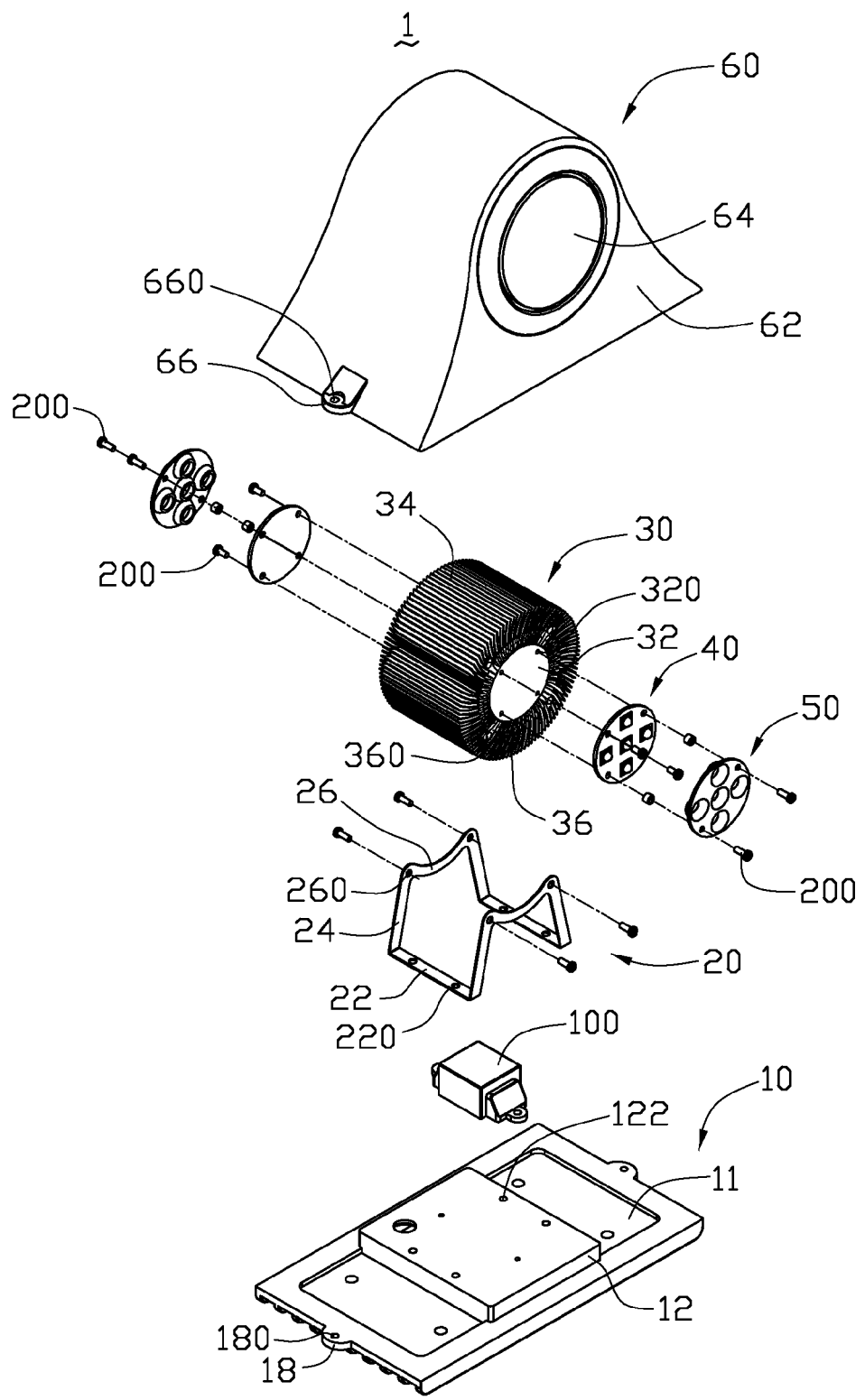
FIG. 2 is an exploded view of the LED lamp of FIG. 1.

Referring to FIGS. 1-2, an LED lamp 1 in accordance with an embodiment of the present invention comprises a lamp base 10 with a plate-like shape, a bracket 20 located at a top side of the lamp base 10, a heat sink 30 suspended above the lamp base 10 by the bracket 20, a plurality of LED modules 40 thermally mounted on two opposite sides of the heat sink 30, and a housing 60 engaging with the lamp base 10 and enclosing the bracket 20, the heat sink 30 and the LED modules 40 therein.

Figure 3:
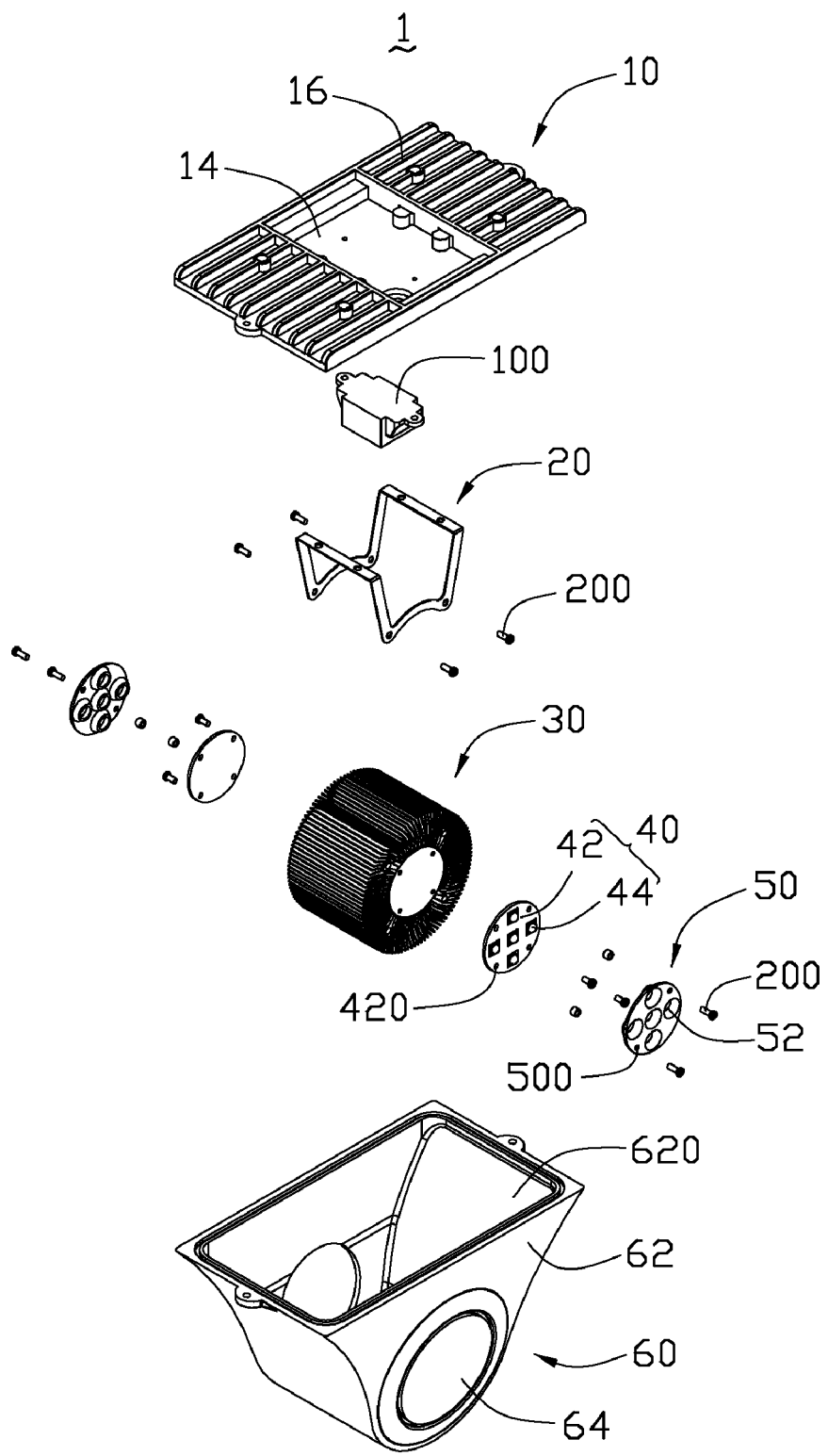
FIG. 3 is an inverted view of the LED lamp of FIG. 2.

Also referring to FIG. 3, the lamp base 10 has a base portion 11 with a rectangular configuration and a rectangular engaging portion 12 projecting upwardly from a center of the base portion 11. The base portion 11 defines a rectangular recess 14 under the engaging portion 12. In this embodiment, a driving circuit unit 100 is electrically connected to the LED modules 40 and is mounted at a center of a top surface of the engaging portion 12. The engaging portion 12 defines four through orifices 122 in two opposite lateral portions thereof for mounting the bracket 20 thereon. A plurality of elongated ribs 16 extends downwardly and perpendicularly from a bottom surface of the base portion 11 and is located at two opposite lateral sides of the recess 14. Two semicircular first protrusions 18 respectively protrude outwardly from two opposite lateral sides of the base portion 11. Each protrusion 18 defines a first mounting hole 180 therein for mounting the housing 60 to the lamp base 10.

Figure 4:
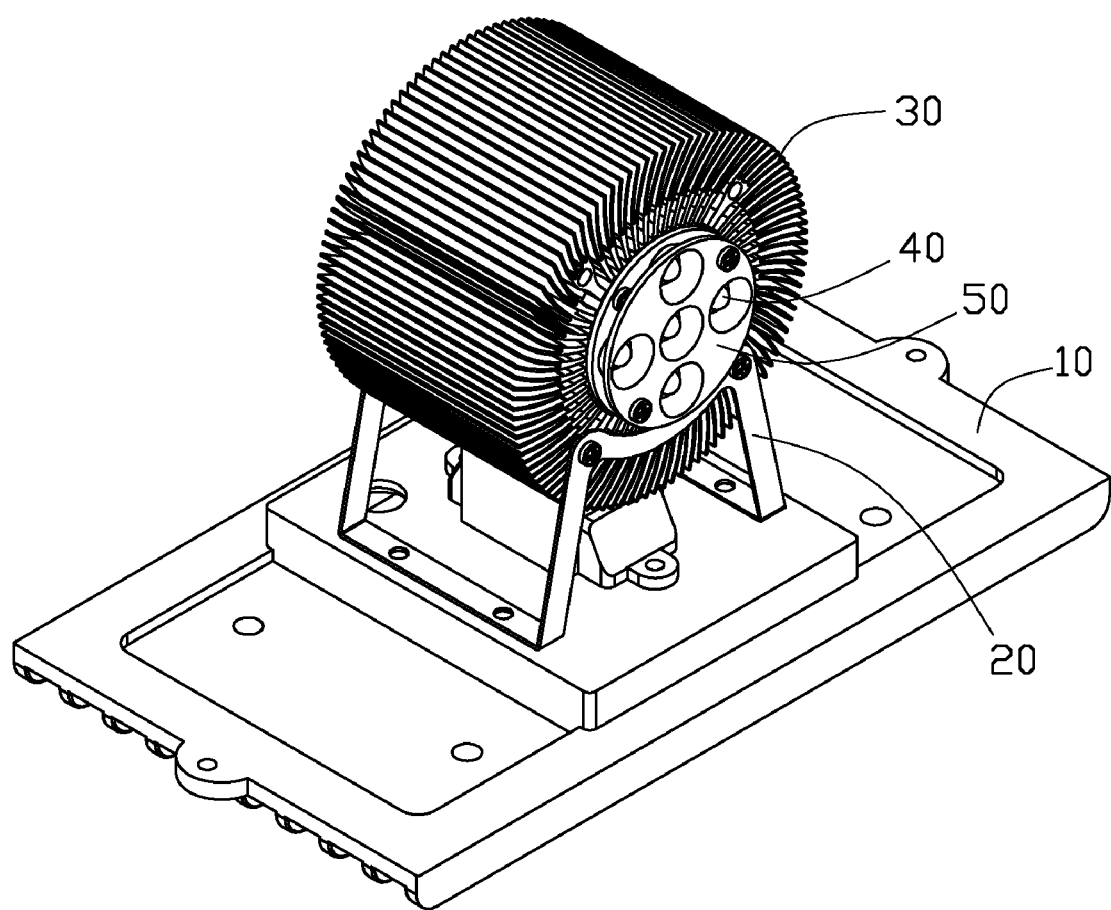
FIG. 4 is a view similar to FIG. 1, with a housing of the LED lamp being removed for clarity.

Also referring to FIG. 4, the bracket 20 is integrally formed by stamping and bending a metal sheet. The bracket 20 comprises two parallel horizontal sections 22 coupled to the top side of the engaging portion 12 of the lamp base 10, a pair of fixing arms 24 respectively extending upwardly and perpendicularly from two opposite ends of each horizontal section 22 for suspending the heat sink 30 above the engaging portion 12, and two connecting sections 26, each interconnecting two upper ends of two fixing arms 24 at a same side of the heat sink 30, for respectively abutting against and supporting the two opposite ends of the heat sink 30. Each horizontal section 22 defines two mounting orifices 220 corresponding to the through orifices 122 of the engaging portion 12 for mounting the bracket 20 on the lamp base 10. Each connecting section 26 curves downwardly. Each connecting section 26 defines two first engaging holes 260 in two opposite ends thereof, respectively, for two screws 200 extending therethrough to engage into the heat sink 30, thereby coupling the bracket 20 to heat sink 30.

The heat sink 30 has a cylindrical configuration and is made of metal with high heat conductivity, such as copper, aluminum, or an alloy thereof. The heat sink 30 comprises a solid post 32 and a plurality of fins 34 radially extending outwardly from an outer circumference of the post 32. In this embodiment, the heat sink 30 is fixed above the lamp base 10 with two opposite ends of the heat sink 30 being sandwiched between the two connecting sections 26 of the bracket 20. Four branches 36 are radially and evenly formed from the outer circumference of the post 32. Distal end of each branch 36 defines a second engaging hole 360 for engagingly receiving the screws 200 which extend through the first engaging holes 260 of the bracket 20. The post 32 defines four threaded holes 320 in each of two opposite ends thereof. The four threaded holes 320 are evenly distributed along a rim of a corresponding end of the post 320 for mounting a corresponding LED module 40 thereon.

Referring to FIGS. 1-4 again, each of the LED modules 40 comprises a circular printed circuit board 42 and a plurality of LEDs 44 evenly arranged on the printed circuit board 42. The printed circuit board 42 defines four first through holes 420 therein adjacent to an edge thereof and located corresponding to the threaded holes 320 of the heat sink 30. In this embodiment, two LED modules 30 are respectively fixed on the two opposite ends of the post 32 by the screws 200 extending through corresponding first through holes 420 of the printed circuit boards 42 and screwing into the threaded holes 320 in the two opposite ends of the post 10.

The LED lamp 1 further comprises two light-guiding boards 50 respectively disposed on the two LED modules 40 for congregating light emitted by the LEDs 44. The light-guiding board 50 defines five tapered cavities 52 in which the LEDs 44 of the LED modules 40 are extended and received, whereby when the LEDs 44 are activated, a part of light emitted from the LEDs 44 is able to emit to outside directly, and the remaining part of the light is reflected by inner faces of the cavities 52 to thus obtain a satisfactory illumination. The light-guiding boards 50 each defines two second through holes 500 therein for the corresponding screws 200 extending therethrough, then inwardly through two spacers (not labeled) and two corresponding first through holes 420 and finally screwing into two corresponding threaded holes 320 of the post 32 to fix the light-guiding board 50 onto the LED module 40 and the heat sink 30.

The housing 60 comprises a main body 62 which defines an enclosing space 620 therein and two circular lenses 64 respectively disposed on two opposite sides of a top of the main body 62 and in alignment with the two LED modules 40. A bottom of the main body 62 has an identical configuration to that of the base portion 11 of the lamp base 10, thereby the housing 60 could fitly cooperate with the lamp base 10 to enclose the bracket 20, the heat sink 30 and the LED modules 40 therein. Two semicircular second protrusions 66 respectively protrude outwardly from two lateral sides of the bottom of the main body 62. Each second protrusion 66 defines a second mounting hole 660 therein for the screw 200 correspondingly extending through and threadedly engaging in the first mounting hole 180 of the lamp base 10. The lenses 64 are located corresponding to the LED modules 40 and made of transparent material such as plastic, glass, or other suitable material availing to transmit light.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED lamp comprising:
    a lamp base;
    a heat sink comprising a round post and a plurality of fins extending outwardly from an outer circumference of the post;
    two LED modules respectively mounted on two opposite ends of the post of the heat sink;
    a bracket fixed on the lamp base and supporting heat sink thereon, thereby suspending the heat sink above the lamp base; and
    a housing engaged on the lamp base and enclosing the bracket, the heat sink and the LED modules therein, wherein light generated by the two LED modules are emitted along two opposite directions through the housing to an outside of the LED lamp.

2. The LED lamp as claimed in claim 1, wherein the bracket comprises two horizontal sections coupled to the lamp base, two connecting sections respectively abutting against two opposite ends of the heat sink and a pair of fixing arms respectively extending upwardly from two opposite ends of each horizontal section, each fixing arm interconnects a corresponding connecting section and a corresponding horizontal section.

3. The LED lamp as claimed in claim 2, wherein the connecting sections are curved downwardly.

4. The LED lamp as claimed in claim 1, wherein a plurality of branches is formed around the outer circumference of the post.

5. The LED lamp as claimed in claim 4, wherein two screws extend respectively through two opposite ends of each connecting section of the bracket and engage into two corresponding branches of the heat sink.

6. The LED lamp as claimed in claim 1, wherein the fins is arranged radially around an axis of the post.

7. The LED lamp as claimed in claim 1, wherein the lamp base has a base portion with a rectangular configuration and a rectangular engaging portion projecting upwardly from a center of the base portion for securing the bracket thereon.

8. The LED lamp as claimed in claim 1, wherein a plurality of elongated ribs extends downwardly from a bottom surface of the lamp base.

9. The LED lamp as claimed in claim 1, wherein each LED module comprises a printed circuit board having a discal shape, and a plurality of LEDs evenly arranged on the printed circuit board.

10. The LED lamp as claimed in claim 9, wherein the LED lamp further comprises a light-guiding board disposed on each LED module for congregating light emitted by the LEDs, the light-guiding board defines a plurality of tapered cavities therein in which the LEDs of the each LED module are respectively extended and received.

11. The LED lamp as claimed in claim 1, wherein the housing comprises a main body which defines an enclosing space therein and two lenses respectively disposed on two opposite sides of a top of the main body for correspondingly covering the LED modules.

12. The LED lamp as claimed in claim 11, wherein a bottom of the main body has an identical configuration to that of the lamp base.

13. An LED lamp comprising:
    a lamp base;
    a heat sink comprising a round post and a plurality of fins extending outwardly from an outer circumference of the post;
    two LED modules respectively mounted on two opposite ends of the heat sink; and
    a bracket comprising two horizontal sections coupled to the lamp base, a pair of fixing arms respectively extending upwardly from two opposite ends of each horizontal section and two connecting sections each interconnecting two fixing arms, wherein the heat sink are sandwiched between the two connecting sections and suspended above the lamp base by the fixing arms; and
    a housing attached to the lamp base and enclosing the heat sink, the two LED modules and the bracket therein.

14. The LED lamp as claimed in claim 13, wherein the connecting sections respectively engage with the two opposite ends of the heat sink, and are curved downwardly.

15. The LED lamp as claimed in claim 13, wherein the fixing arms are parallel to each other.

16. The LED lamp as claimed in claim 13, wherein the fixing arms are perpendicular to the horizontal section.

17. The LED lamp as claimed in claim 13, wherein each LED module comprises a printed circuit board having a discal shape, and a plurality of LEDs evenly arranged on the printed circuit board.

18. The LED lamp as claimed in claim 17, wherein the LED lamp further comprises a light-guiding board disposed on each LED module for congregating light emitted by the LEDs, the light-guiding board defines a plurality of tapered cavities in which the LEDs of the each LED module are respectively extended and received.

19. The LED lamp as claimed in claim 13, wherein the housing comprises a main body which defines an enclosing space therein and two lenses respectively disposed on two opposite sides of a top of the main body for correspondingly covering the LED modules.

20. The LED lamp as claimed in claim 19, wherein a bottom of the main body has an identical configuration to that of the lamp base.

* * * * *